United States Patent [19]

Adachi et al.

[11] Patent Number: 5,272,452
[45] Date of Patent: Dec. 21, 1993

[54] PLL FREQUENCY SYNTHESIZER WITH VARIABLE BANDWIDTH LOOP FILTER

[75] Inventors: Hisashi Adachi, Minoo; Hiroaki Kosugi, Hirakata, both of Japan

[73] Assignee: Matsushita Electric Industrial Co., Ltd., Osaka, Japan

[21] Appl. No.: 932,877

[22] Filed: Aug. 20, 1992

[30] Foreign Application Priority Data

Aug. 20, 1991 [JP] Japan .................................. 3-207832

[51] Int. Cl.$^5$ .......................... H03L 7/093; H03L 7/18
[52] U.S. Cl. ......................................... 331/17; 331/14; 331/25
[58] Field of Search ................... 331/17, 14, 25

[56] References Cited

U.S. PATENT DOCUMENTS

| | | | |
|---|---|---|---|
| 3,909,735 | 9/1975 | Anderson et al. | 331/10 |
| 4,077,015 | 2/1978 | Carson et al. | 331/4 |
| 4,752,749 | 6/1988 | Moger | 331/17 |
| 4,774,480 | 9/1988 | Sato et al. | 331/1 A |
| 5,146,187 | 9/1992 | Vandegraaf | 331/17 |
| 5,170,130 | 12/1992 | Ichihara | 331/17 X |

FOREIGN PATENT DOCUMENTS

| | | |
|---|---|---|
| 61-134126 | 6/1986 | Japan . |
| 62-39342 | 3/1987 | Japan . |
| 62-139138 | 9/1987 | Japan . |
| 62-216528 | 9/1987 | Japan . |
| 2-5622 | 1/1990 | Japan . |
| 2-177725 | 7/1990 | Japan . |

*Primary Examiner*—Siegfried H. Grimm
*Attorney, Agent, or Firm*—Wenderoth, Lind & Ponack

[57] ABSTRACT

A voltage controlled oscillator (VCO), a frequency divider, a phase detector, and a loop filter are connected to form a phase-locked loop. The input line of the loop filter is branched into two. One branch is connected to the ground through a first resistor, a second resistor and a capacitor which are connected in series. The other branch is connected between the second resistor and the capacitor through a switch and a bypass resistor which are connected in series. The connection point of the first resistor and second resistor are connected to the VCO as the output terminal of the loop filter. When the switch is off, the bandwidth of the loop filter is narrow, and when the switch is on, the bandwidth of the loop filter is broad.

13 Claims, 5 Drawing Sheets

5,272,452

PLL FREQUENCY SYNTHESIZER WITH VARIABLE BANDWIDTH LOOP FILTER

BACKGROUND OF THE INVENTION

1. Field of the Invention

The present invention relates to a PLL (phase-locked loop) frequency synthesizer with a loop filter of variable bandwidth.

2. Description of the Prior Art

This type of PLL frequency synthesizer is hitherto constructed, for example, as shown in the U.S. Pat. No. 3,909,735. This prior art comprises a loop filter with a broad bandwidth and a loop filter with a narrow bandwidth. When changing over the frequency, first the loop filter of a broad bandwidth is selected, and finally it is changed to the loop filter with a narrow bandwidth. However, since the changeover time of frequency depends greatly on the stabilizing time of output voltage of the loop filter with a narrow bandwidth, it is not suited basically to very fast frequency changeover. Besides, there is a difference in the output voltage of the individual loop filters, it is necessary to control to prevent large fluctuations of the frequency due to sudden application of the differential voltage to the input terminal of the VCO (voltage controlled oscillator) at the time of changeover. Accordingly, in addition to the two loop filters, a circuit for suppressing fluctuations at the time of changeover is needed, and the entire circuit scale becomes large.

SUMMARY OF THE INVENTION

It is hence a primary object of the invention to present a PLL frequency synthesizer capable of changing over at high speed with small fluctuations of frequency when the bandwidth of the loop filter is changed over, in a simple constitution.

A PLL frequency synthesizer of the invention comprises a VCO, a frequency divider, a phase detector, and a loop filter, which are connected to form a phase-locked loop. The input line of the loop filter is branched in two, and one branch is connected to the ground through a first resistor, a second resistor and a capacitor which are connected in series. The other branch is connected between the second resistor and the capacitor through a switch and a bypass resistor which are connected in series. The connection point of the first resistor and the second resistor is connected to the VCO as the output terminal of the loop filter. The switch is turned on or off by a switch control signal supplied from outside.

When the switch is off, the loop filter is a filter of narrow bandwidth composed of the first resistor, the second resistor and the capacitor. Suppose the resistance value of the first resistor to be Ra, the resistance value of the second resistor to be Rb, the capacity of the capacitor to be C, and the Laplace operator to be s. Since current hardly flows from the loop filter to the VCO, the transfer function Foff(s) of the loop filter when the switch is off is expressed as follows.

$$Foff(s) = (1 = sCRb)/(1 + sC(Ra + Rb)) \qquad (1)$$

When the switch is on, the bypass resistor is connected parallel to the first resistor and second resistor. Since current hardly flows from the loop filter to the VCO, here, supposing the resistance value of the bypass resistor to be Rsw, the transfer function Fon(s) of the loop filter when the switch is on is expressed as follows:

$$Fon(s) = (1 + sCRbon)/(1 + sC(Raon + Rbon)) \qquad (2)$$

where
  Raon = Ra·Rsw/(Ra + Rb + Rsw)
  Rbon = Rb·Rsw/(Ra + Rb + Rsw)

Seeing Raon < Ra, Rbon < Rb, equation (1) and equation (2) mean that the circuit when the switch is on is the same in composition as the circuit when the switch is off, being equivalent when each resistance value becomes small. Therefore, the bandwidth of the loop filter is broad, and the loop response speed is fast. The composition of the loop filter at this time is, similarly to the case when the switch is off, a general configuration consisting of two resistors and one capacitor, so that the loop design is easy.

When changing over the frequency, first the switch is turned on to set up a loop filter with a broad bandwidth. When the output signal is nearly locked at the desired frequency, the switch is turned off to change over to a loop filter with a narrow bandwidth. The voltage Vc of the capacitor does not change just before and after the changeover. Supposing the input voltage to be Vi, the output voltage Von just before changeover and the output voltage Voff just after changeover are as follows:

$$Von = Vc + (Vi - Vc) \cdot Rbon/(Raon + Rbon)$$

$$Voff = Vc + (Vi - Vc) \cdot Rb/(Ra + Rb)$$

where Rbon/(Raon + Rbon) = Rb/(Ra + Rb). Hence Von = Voff, and the output voltage of the loop filter does not change before and after changeover, so that the output frequency hardly fluctuates. Moreover, depending on the value of Rsw, the transient response characteristic when the switch is on can be changed. In the case of Rsw << Ra, Rb, the frequency can be changed over at an extremely high speed.

More preferably, in the constitution, plural stages of low pass filters may be installed between the input terminal and first resistor of the loop filter.

DETAILED DESCRIPTION OF THE PREFERRED EMBODIMENTS

Figure 1:
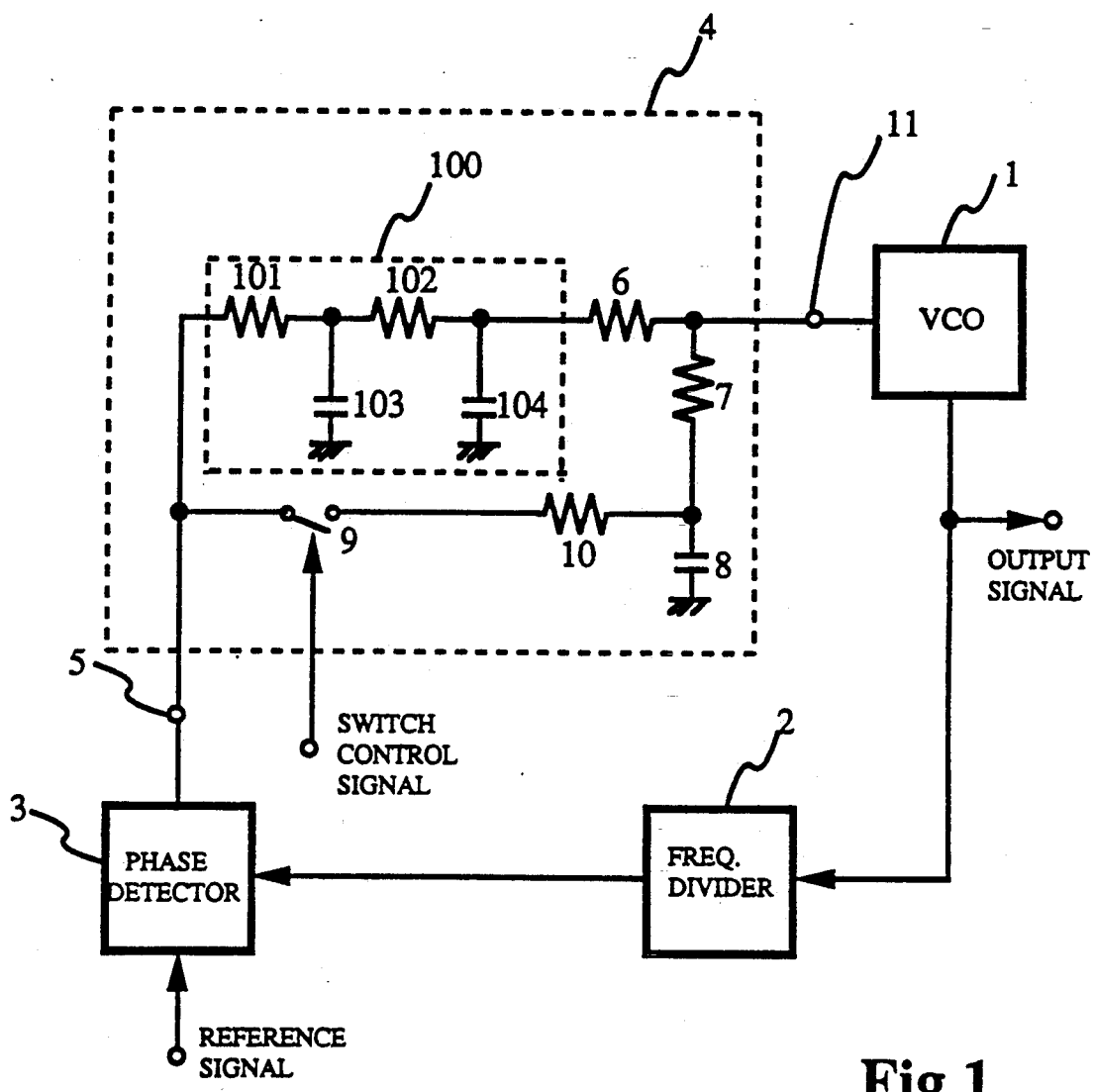
FIG. 1 is a block diagram of an embodiment of the invention.

FIG. 1 is a block diagram of a PLL frequency synthesizer in an embodiment of the invention.

In FIG. 1, the output of a VCO 1 is branched into two, and one is an output signal of the PLL frequency synthesizer and the other enters a frequency divider 2.

A phase detector 3 compares the reference signal entered from outside and the output signal of the frequency divider 2, and delivers a signal corresponding to the phase error of the two. The output of the phase detector 3 is smoothed by a loop filter 4, and enters the VCO 1 to control the output frequency. The loop filter 4 is composed of a low pass filter 100, a resistor 6, a resistor 7, a capacitor 8, a switch 9, and a bypass resistor 10. The low pass filter and the switch 9 are connected to the input terminal 5 of the loop filter 4. The output of the low pass filter 100 is connected to the ground through the resistor 6, resistor 7, and capacitor 8. The switch 9 is connected between the resistor 7 and capacitor 8 through the bypass resistor 10. The output of the loop filter 4 is connected to the input terminal of the VCO 1 from the output terminal 11 which is the connection point of the resistor 6 and resistor 7. In the low pass filter 100, the series connection of resistor 101 and resistor 102 and the ground are connected with a capacitor 103, and the output side of the resistor 102 and the ground are connected with a capacitor 104. The switch 9 is turned on or off as being controlled from outside by a switch control signal.

In thus composed frequency synthesizer in the first embodiment, the operation is described below.

The VCO 1, frequency divider 2, phase detector 3, and loop filter 4 composed a phase-locked loop, which operates so that the ratio of the frequency of output signal and frequency of reference signal may be equal to the dividing ratio of the frequency divider 2. The low pass filter 100 is a filter of a broad bandwidth for removing the noise other than the band of the PLL loop, and the capacity of the capacitors 103, 104 is small.

When the switch 9 is off, the loop filter 4 is a filter of a narrow bandwidth composed of low pass filter 100, resistor 6, resistor 7 and capacitor 8. At this time, the response speed of the loop is slow, but the noise of the output signal is low in the PLL frequency synthesizer. Here, the current flowing into the input terminal of the VCO 1 from the loop filter 4 is as small as to be ignored. Besides, since the bandwidth of the low pass filter 100 is sufficiently broad as compared with the entire bandwidth of the loop filter 4, the capacitor 103 and capacitor 104 of the low pass filter 100 may be ignored with respect to the signal of low frequency. Hence, supposing the total resistance of the resistors 6, 101, 102 to be Ra, the resistance of the resistor 7 to be Rb, the capacity of the capacitor 8 to be C, and the Laplace operator to be s, the transfer function Foff(s) of the loop filter 4 when the switch 9 is off may be approximately expressed as follows:

$$Foff(s) = (1 + sCRb)/(1 + sC(Ra + Rb)) \qquad (3)$$

When the switch 9 is on, the bypass resistor 10 is connected parallel to the low pass filter 100, the resistor 6 and the resistor 7. Here, same as when the switch 9 is off, the current flowing into the input terminal of the VCO 1 from the loop filter 4 is as small as to be ignored, so that the capacitor 103 and capacitor 104 may be ignored. Here, supposing the resistance of the bypass resistor 10 to be Rsw, the transfer function Fon(s) of the loop filter when the switch 9 is on may be approximated as follows:

$$Fon(s) = (1 + sCRbon)/(1 + sC(Raon + Rbon)) \qquad (4)$$

where

Raon = Ra·Rsw/(Ra + Rb + Rsw)
Rbon = Rb·Rsw/(Ra + Rb + Rsw)

Seeing that Raon < Ra, Rbon < Rb, equation (3) and equation (4) mean that the circuit when the switch is on is same in composition as the circuit when the switch is off, being equivalent to when each resistance value becomes small. At this time, the characteristic of the loop varies with the resistance value of the bypass resistor 10, and the response speed of the loop becomes faster when the resistance value is smaller. An equivalent construction of the loop filter 4 is general, being composed of two resistors and a capacitor, and its characteristic may be easily set.

When changing over the frequency of the output signal, the switch 9 is turned on when starting the changeover, and the switch 9 is turned off when nearly locked. In the stationary state, the switch 9 is kept in off position. The voltage Vc of the capacitor does not change immediately before or after the changeover. Supposing the input voltage to be Vi, the output voltage Voff just before changeover and the output voltage Von immediately after changeover are as follows:

$$Von = Vc + (Vi - Vc) \cdot Rbon/(Raon + Rbon)$$

$$Voff = Vc + (Vi - Vc) \cdot Rb/(Ra + Rb)$$

where Rbon/(Raon + Rbon) = Rb/(Ra + Rb) hence Von = Voff, and the output voltage of the loop filter is not changed immediately before and after the changeover, and the output frequency hardly varies. Therefore, supposing Rsw << Ra, Rb, the frequency may be changed over at extremely high speed. In the stationary state, by narrowing the bandwidth of the loop, the noise may be suppressed.

Figure 2:
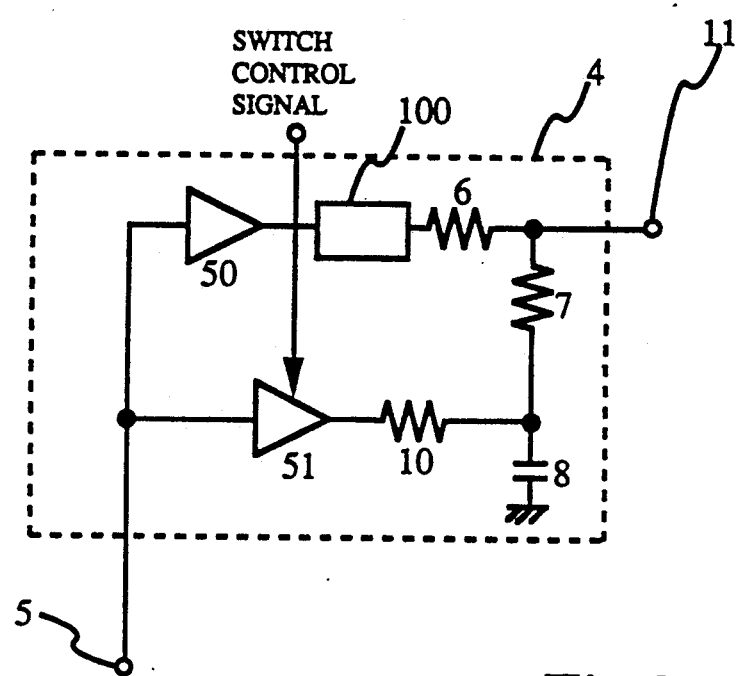
FIG. 2 is a drawing showing only the loop filter part in other constitutional example of the loop filter in FIG. 1.

FIG. 2 is other constitutional example of the loop filter 4 in FIG. 1, and only the inside of the loop filter 4 is shown.

In the constitution in FIG. 2, a buffer amplifier 50 is installed between the input terminal 5 of the loop filter 4 and the low pass filter 100, and the switch 9 is replaced by a 3-state buffer amplifier 51. The 3-state buffer amplifier 51 changes its output in high impedance state by a switch control signal. In this constitution, the 3-state buffer amplifier 51 functions as the switch 9 in FIG. 1. The off state of the switch 9 corresponds to the high impedance state of the 3-state buffer amplifier 51, and the on state of the switch 9 corresponds to the ordinary action state of the 3-state buffer amplifier 51. In this constitution example, when the 3-state buffer amplifier 51 is in ordinary action, the current feed capability to the capacitor 8 is higher than in the case of FIG. 1, so that the bandwidth of the loop filter 4 may be set broader easily.

Figure 3:
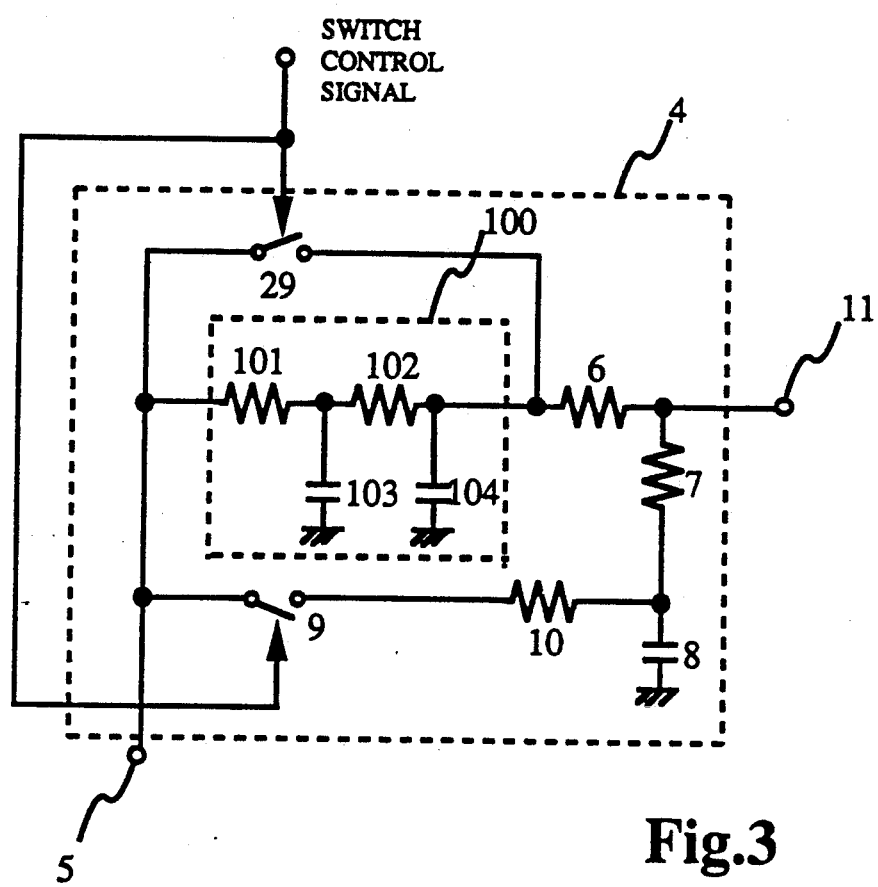
FIG. 3 is a drawing showing only the loop filter part in a constitutional example of adding a switch to the loop filter in FIG. 1.

FIG. 3 is a constitutional example of connecting the input and output of the low pass filter 100 by a switch 29 in the loop filter 4 in FIG. 1, and only the loop filter part is shown. The switch 29, like the switch 9, is turned on or off by switch control signal.

When the switch 9 and switch 29 are off, it is same as when the switch 9 in FIG. 1 is off, and the loop filter 4 is a filter with a narrow bandwidth. Hence, supposing the total resistance of the resistors 6, 101, 102 to be Ra, the resistance of the resistor 7 to be Rb, the capacity of the capacitor 8 to be C, and the Laplace operator to be s, the transfer function Foff(s) of the loop filter 4 when the switch 9 and switch 29 are off is approximately expressed in the following equation.

$$F_{off}(s) = (1+sCRb)/(1+sC(Ra+Rb)) \quad (7)$$

When the switch 9 and switch 29 are on, the bypass resistor 10 is connected parallel to the resistor 6 and resistor 7, and the low pass filter 100 is short-circuited between its input and output. Supposing the resistance of the resistor 6 to be R6, and the resistance of the bypass resistor 10 to be Rsw, the transfer function $F_{on}(s)$ of the loop filter 4 when the switch 9 and switch 29 are on is approximately expressed in the following equation:

$$F_{on}(s) = (1+sCRbon)/(1+sC(R6on+Rbon)) \quad (8)$$

where
R6on = R6·Rsw/(R6+Rb+Rsw)
Rbon = Rb·Rsw/(Ra+Rb+Rsw)

Seeing that R6on<Ra, Rbon<Rb, equation (7) and equation (8) mean that the circuit when the switch 9 and switch 29 are on is same in composition as the circuit when the switch 9 and switch 29 are off, being equivalent to when each resistance value becomes small. At this time, the bandwidth of the loop filter 4 becomes broader by setting small the resistance value of the bypass resistor 10 in particular, and the loop characteristic may be varied by changing the ratio of the resistor 6 and resistor 7. Therefore, the possible setting range of the loop characteristic when the bandwidth is broader is wider than in FIG. 1.

When changing over the frequency, first the switch 9 and switch 29 are turned on to broaden the bandwidth. When the output signal is nearly locked at the desired frequency, the switch 9 and switch 29 are turned off to narrow the bandwidth of the loop filter 4. In the stationary state, the switch 9 and switch 29 are set in off state. The voltage Vc of the capacitor does not change just before and after the changeover. Supposing the input voltage to be V1, the output voltage Voff just before changeover and the output voltage Von immediately after changeover are as follows:

$$Von = Vc + (Vi-Vc) \cdot Rbon/(R6on+Rbon)$$

$$Voff = Vc + (Vi-Vc) \cdot Rb/(Ra+Rb)$$

Here, when the resistance value of the resistor 6 is greater than the resistance value of the resistor 101, resistor 102, Ra and R6 are nearly equal to each other, and therefore Rbon/(R6on+Rbon)

and

Rb/(Ra+Rb)

are nearly equal to each other, hence Von and Voff are nearly equal. Therefore, the fluctuations of the output frequency at the time of changeover are small, and the frequency may be changed over at high speed.

Figure 4:
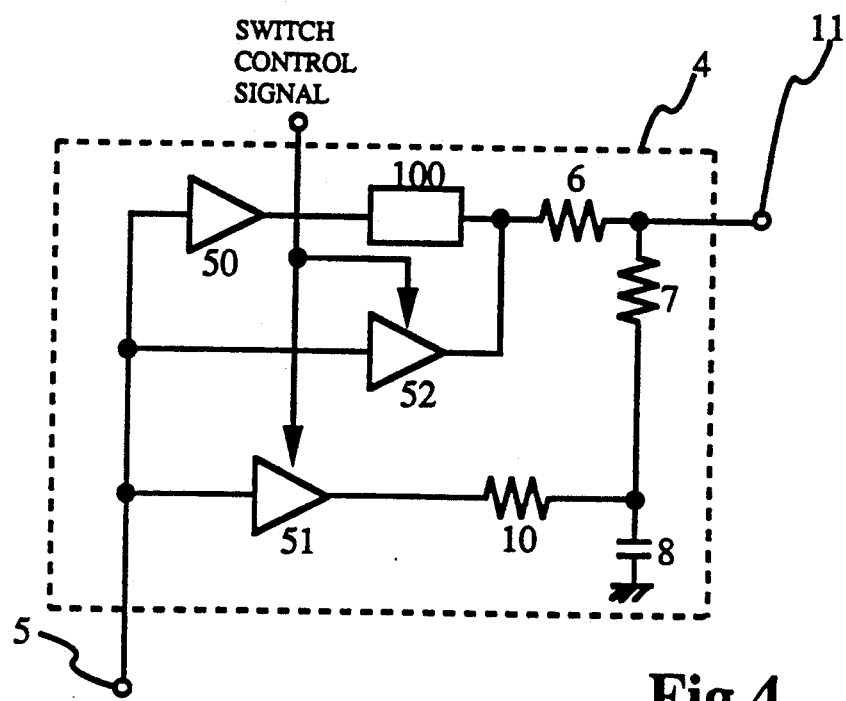
FIG. 4 is a drawing showing only the loop filter part in a different constitutional example of the loop filter in FIG. 3.

FIG. 4 shows only the loop filter part in a different constitutional example of the loop filter 4 in FIG. 3.

In the constitution in FIG. 4, a buffer amplifier 50 is installed between the input terminal 5 of the loop filter 4 and the low pass filter 100, and the switch 9 and switch 29 are respectively replaced by 3-state buffer amplifiers 51, 52. The 3-state buffer amplifiers 51, 52 change their output in the high impedance state by switch control signal. In this constitution, the 3-state buffer amplifiers 51, 52 function as the switch 9 and switch 29 in FIG. 3. The off state of the switch 9 and switch 29 corresponds to the high impedance state of the 3-state buffer amplifiers 51, 52, and the on state of the switch 9 and switch 29 corresponds to the ordinary action state of the 3-state buffer amplifiers 51, 52. In this constitutional example, when the 3-state buffer amplifiers 51, 52 are in ordinary action, the current feed capability to the capacitor 8 is higher than in the case of FIG. 3, so that the bandwidth of the loop filter 4 may be set wider easily.

Figure 5:
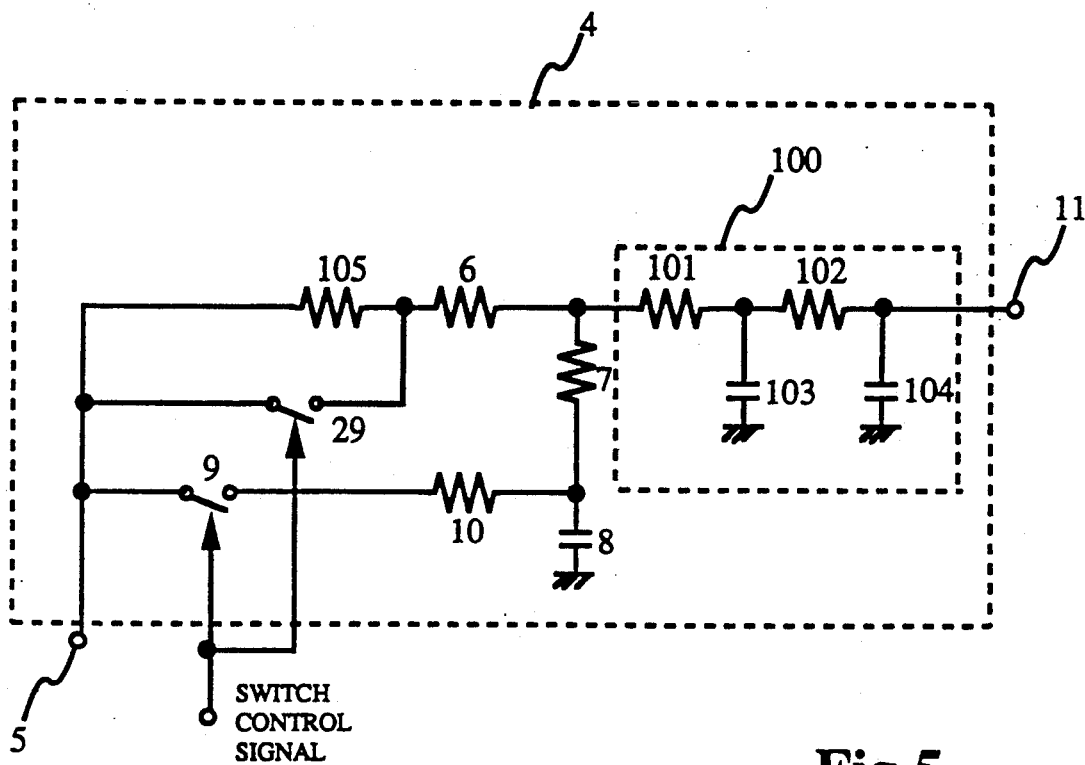
FIG. 5 is a drawing showing only the loop filter part in a constitutional example of installing a low pass filter at the output side, in the loop filter in FIG. 3.

FIG. 5 is a constitutional example of installing the low pass filter 100 at the output side from the resistor 6, in the loop filter 4 in FIG. 3, and only the loop filter part is shown.

In the constitutional example of FIG. 5, a resistor 105, switch 9 and switch 29 are connected to the input terminal 5 of the loop filter 4. The other end of the resistor 105 is connected to the ground through the resistor 6, resistor 7, and capacitor 8. The connection point of the resistor 6 and resistor 7 are connected to an output terminal 11 through the low pass filter 100. The other end of the switch 9 is connected between the resistor 7 and capacitor 8 through a bypass resistor 10. The other end of the switch 29 is connected between the resistor 105 and the resistor 6. The low pass filter 100 is composed same as in FIG. 1. The switch 9 and switch 29 are turned on or off as being controlled simultaneously from outside by switch control signal.

The low pass filter 100 is a filter with a broad bandwidth for removing the noise other than the band of the PLL loop, and the capacity of the capacitor 103 and capacitor 104 is small. Hence, the current flowing from the connection point of the resistor 6 and resistor 7 to the low pass filter 100 is sufficiently small as compared with the current flowing in the capacitor 8, and FIG. 5 is nearly equivalent to FIG. 3, in which the low pass filter is replaced placed by the resistor 105.

When the switch 9 and switch 29 are off, the loop filter 4 is a filter of a narrow bandwidth consisting of resistor 105, resistor 6, resistor 7, capacitor 8, and low pass filter 100.

When the switch 9 and switch 29 are on, the resistor 105 is short-circuited by the switch 29, and the bypass resistor 10 is connected parallel to the resistor 6 and resistor 7 by the switch 9. At this time, in the same principle of operation as in the example in FIG. 3, the bandwidth of the loop filter 4 is broader when the resistance value of the bypass resistor 10 is smaller. Besides, various loop characteristics may be obtained by varying the ratio of the resistor 6 and resistor 7.

When changing over the frequency of the output signal, the switch 9 and switch 29 are turned on when starting the changeover, and when nearly locked, the switch 9 and switch 29 are turned off. In the stationary state, the switch 9 and switch 29 are set in off state. Thus, during changeover, the bandwidth of the loop is broadened to change over the frequency at high speed, and in the stationary state, the bandwidth of the loop is narrow to lower the noise level. Besides, when the switch 9 and switch 29 are in on state, the noise outside the band of the PLL loop is removed by the low pass filter 100, so that an output low in the noise outside the band may be always obtained.

The above embodiments are typical cases in the invention, and the invention is not limited to these illustrations alone.

What is claimed is:

1. A PLL frequency synthesizer comprising:
a voltage controlled oscillator,
a frequency divider for dividing a frequency of an output of the voltage controlled oscillator;
a phase detector for comparing a phase of an output of the frequency divider with a phase of a reference signal to obtain a phase difference signal; and
a loop filter for smoothing the phase difference signal from the phase detector and delivering the smoothed signal to the voltage controlled oscillator,
wherein the loop filter has an input terminal branched into two, one branch being connected to the ground through a first resistor, a second resistor and a capacitor which are connected in series, the other branch being connected between the second resistor and the capacitor through a switch and a bypass resistor which are connected in series, a connection point of the first resistor and the second resistor being connected to the voltage controlled oscillator, and the switch being turned on or off by an externally given switch control signal.

2. A PLL frequency synthesizer of claim 1, further comprising a buffer amplifier provided between the input terminal of the loop filter and the first resistor, whrein the switch is a 3-state buffer amplifier, whose output is set in high impedance state by the switch control signal.

3. A PLL frequency synthesizer of claim 1, further comprising a low pass filter provided between the connection point of the first resistor and the second resistor and the output terminal of the loop filter.

4. A PLL frequency synthesizer of claim 3, wherein the low pass filter comprises a plurality of stages of filters each comprising a resistor connected in series and a capacitor to be branched and connected to the ground.

5. A PLL frequency synthesizer of claim 1, wherein the first resistor is divided into two by a dividing point, and the dividing point and the input terminal of the loop filter are connected through a second switch which is turned on or off by the switch control signal.

6. A PLL frequency synthesizer comprising:
a voltage controlled oscillator;
a frequency divider for dividing a frequency of an output of the voltage controlled oscillator;
a phase detector for comparing a phase of an output of the frequency divider with a phase of a reference signal to obtain a phase difference signal; and
a loop filter for smoothing the phase difference signal from the phase detector and delivering the smoothed signal to the voltage controlled oscillator,
wherein the loop filter has an input terminal branched into two, one branch being connected to a low pass filter whose output is connected to the ground through a first resistor, a second resistor and a capacitor which are connected in series, the other branch being connected between the second resistor and the capacitor through a switch and a bypass resistor which are connected in series, a connection point of the first resistor and the second resistor being connected to the voltage controlled oscillator, and the switch being turned on or off by an externally given switch control signal.

7. A PLL frequency synthesizer of claim 6, wherein the low pass filter comprises a plurality of stages of filters each comprising a resistor connected in series and a capacitor to be branched and connected to the ground.

8. A PLL frequency synthesizer of claim 7, further comprising a buffer amplifier provided between the input terminal of the loop filter and the low pass filter, wherein the switch is a 3-state buffer amplifier whose output is set in high impedance state by the switch control signal.

9. A PLL frequency synthesizer comprising:
a voltage controlled oscillator,
a frequency divider for dividing a frequency of an output of the voltage controlled oscillator;
a phase detector for comparing a phase of an output of the frequency divider with a phase of a reference signal to obtain a phase difference signal; and
a loop filter for smoothing the phase difference signal from the phase detector and delivering the smoothed signal to the voltage controlled oscillator,
wherein the loop filter has an input terminal branched into three, one branch being connected to a low pass filter whose output is connected to the ground through a first resistor, a second resistor and a capacitor which are connected in series, a second branch being connected between the second resistor and the capacitor through a first switch and a bypass resistor which are connected in series, a final branch being connected between the low pass filter and the first resistor through a second switch, a connection point of the first resistor and the second resistor being connected to the voltage controlled oscillator, and the first switch and the second switch are turned on or off by an externally given switch control signal.

10. A PLL frequency synthesizer of claim 9, wherein the low pass filter comprises a plurality of stages of filters each comprising a resistor connected in series and a capacitor to be branched and connected to the ground.

11. A PLL frequency synthesizer of claim 10, further comprising a buffer amplifier provided between the input terminal of the loop filter and the low pass filter, wherein each switch is a 3-state buffer amplifier whose output is set in high impedance state by the switch control signal.

12. A PLL frequency synthesizer of claim 3 wherein the first resistor is divided into two by a dividing point, and the dividing point and the input terminal of the loop filter are connected through a second switch which is turned on or off by the switch control signal.

13. A PLL frequency synthesizer of claim 4 wherein the first resistor is divided into two by a dividing point, and the dividing point and the input terminal of the loop filter are connected through a second switch which is turned on or off by the switch control signal.

* * * * *